United States Patent
Yu

[19]

[11] Patent Number: 6,066,533

[45] Date of Patent: May 23, 2000

[54] MOS TRANSISTOR WITH DUAL METAL GATE STRUCTURE

[75] Inventor: Bin Yu, Fremont, Calif.

[73] Assignee: Advanced Micro Devices, Inc., Sunnyvale, Calif.

[21] Appl. No.: 09/163,290

[22] Filed: Sep. 29, 1998

[51] Int. Cl.[7] .............................................. H01L 21/8234
[52] U.S. Cl. ...................... 438/275; 438/283; 438/299; 438/585; 438/587
[58] Field of Search ................................... 438/275, 283, 438/294, 299, 585, 587, 595

[56] References Cited

U.S. PATENT DOCUMENTS

| | | | |
|---|---|---|---|
| 5,824,585 | 10/1998 | Wen ......................................... | 438/275 |
| 5,858,848 | 1/1999 | Gardner et al. ......................... | 438/305 |
| 5,960,270 | 9/1999 | Misra et al. ............................. | 438/197 |
| 5,970,331 | 10/1999 | Gardner et al. ......................... | 438/199 |

*Primary Examiner*—Michael Trinh
*Assistant Examiner*—Khanh Duong
*Attorney, Agent, or Firm*—LaRiviere, Grubman & Payne, LLP

[57] ABSTRACT

A method for making a ULSI MOSFET includes depositing a high-k gate insulator on a silicon substrate and then depositing a field oxide layer over the gate insulator. The field oxide layer is masked with photoresist and the photoresist patterned to establish first gate windows, and the oxide below the windows is then etched away to establish first gate voids in the oxide. The first gate voids are filled with a first metallic gate electrode material that is suitable for establishing a gate electrode of, e.g., an N-channel MOSFET. Second gate voids are similarly made in the oxide and filled with a second gate electrode material that is suitable for establishing a gate electrode of, e.g., an P-channel MOSFET or another N-channel MOSFET having a different threshold voltage than the first MOSFET. With this structure, plural threshold design voltages are supported in a single ULSI chip that uses high-k gate insulator technology.

7 Claims, 3 Drawing Sheets

MOS TRANSISTOR WITH DUAL METAL GATE STRUCTURE

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate and separated therefrom by a gate insulator. Source and drain regions are then formed in the substrate beneath the gate by implanting appropriate dopant materials into the areas of the substrate that are to become the source and drain regions. This generally-described structure cooperates to function as a transistor.

Importantly, as mentioned above the gate must be insulated from the source and drain regions by a thin gate insulator, typically a layer of oxide. As the size of the transistors is reduced by ULSI technology, the thickness of the gate insulator becomes ever smaller. Owing to the relatively high electric field across the gate insulator layer, however, charge carriers undesirably can tunnel across the gate insulator layer, particularly when the gate insulator layer is made very thin as it is in ULSI technology. This renders the transistor "leaky", degrading its performance.

To alleviate this problem, high-k dielectrics (dielectrics that have high dielectric constants) are used as the gate insulator. Unfortunately, undesirable chemical reactions can occur between the high-k gate insulator and the conventional polysilicon gate electrode above the gate insulator. For this reason, it can be advantageous to use metal gate electrode materials in place of or in addition to the polysilicon when high-k material is used as the gate insulator.

The present invention recognizes, however, that a metal electrode that is sufficient for establishing a gate of a P-channel MOSFET might not be sufficient for establishing a gate of an N-channel MOSFET. Specifically, as understood by the present invention a metal electrode that satisfies the threshold voltage design for one type of MOSFET might not satisfy the threshold voltage design for the opposite type of MOSFET or for the same type of MOSFET having a different threshold voltage requirement. As further recognized by the present invention, greater flexibility in designing and implementing MOSFET circuits on ULSI devices would be provided if a single ULSI semiconductor chip were able to incorporate high-K dielectric gate insulators and the metal gate electrodes they entail, and also support more than one threshold voltage. Fortunately, the present invention addresses this consideration.

BRIEF SUMMARY OF THE INVENTION

A method is disclosed for forming at least two types of field effect transistors (FET) on a semiconductor substrate, each type being characterized by a respective threshold voltage. The method includes depositing a high-k gate insulator on the substrate, and depositing a field oxide layer on the gate insulator. Also, the method includes forming at least first and second gate voids in the field oxide layer. A first metal gate electrode is deposited in the first gate void, with the first gate electrode including a first material. Similarly, a second metal gate electrode is deposited in the second gate void, and the second gate electrode includes a second material. In accordance with the present invention, the second material is different from the first material.

In the preferred embodiment, the gate insulator is characterized by a dielectric constant of at least twenty five (25). The preferred gate insulator can be made of, e.g., $TiO_2$ or $Ta_2O_5$. Also, at least one of the metal gate electrodes is made of material selected from the group of materials including tungsten, titanium (Ti), titanium nitride (TiN), tantalum (Ta), tantalum nitride, and molybdenum (Mo).

Isolation trenches preferably are formed in the substrate. The gate voids are established above and between the trenches, that is, each gate void is substantially equidistant from two adjacent trenches.

In a particularly preferred embodiment, the step of forming the gate voids in the field oxide layer includes depositing a first photoresist layer on the field oxide layer, patterning the first photoresist layer to form a first gate window over the field oxide layer, and then removing portions of the field oxide layer below the gate window to thereby establish the first gate void. Likewise, a second photoresist layer is deposited on the field oxide layer and patterned to form a second gate window over the field oxide layer. Portions of the field oxide layer below the gate window are removed to thereby establish the second gate void. A semiconductor device made in accordance with the method, and a digital processing apparatus incorporating the semiconductor device, are also disclosed.

In another aspect, a method for making a semiconductor device includes depositing a field oxide layer on a semiconductor substrate, and etching away first portions of the field oxide to establish first gate voids. The method also includes filling the first gate voids with a first gate electrode material to establish first field effect transistor (FET) gate electrodes. Moreover, the method includes etching away second portions of the field oxide to establish second gate voids, and then filling the second gate voids with a second gate electrode material to establish second FET gate electrodes. The second gate electrode material is different from the first gate electrode material.

In still another aspect, a semiconductor device includes at least a first field effect transistor (FET) having a first voltage threshold and a second FET having a second voltage threshold. The voltage thresholds are different from each other. As disclosed in detail below, the first FET includes a first gate electrode disposed above a silicon substrate, whereas the second FET includes a second gate electrode disposed above a silicon substrate. A gate insulator is sandwiched between the substrate and gate electrodes. As intended by the present invention, the first gate electrode is made of a first material and the second gate electrode is made of a second material different than the first.

Other features of the present invention are disclosed or apparent in the section entitled "DETAILED DESCRIPTION OF THE INVENTION".

DETAILED DESCRIPTION OF THE INVENTION

Figure 1:
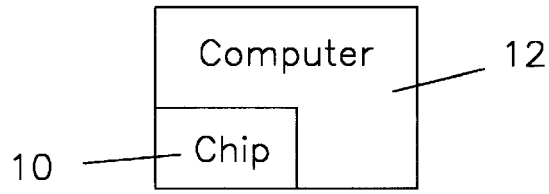
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
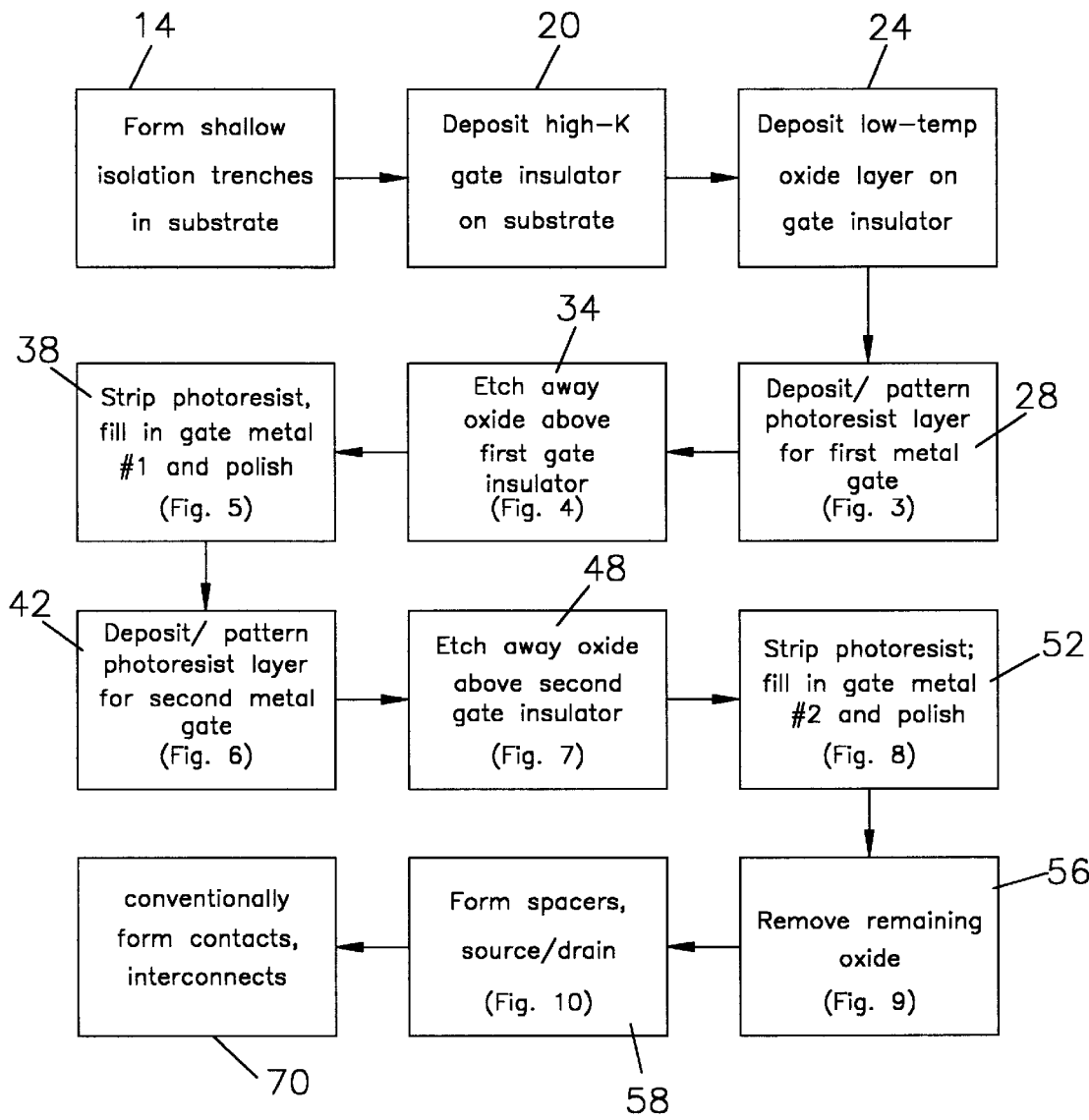
FIG. 2 is a flow chart showing the steps of the present invention.
Figure 3:
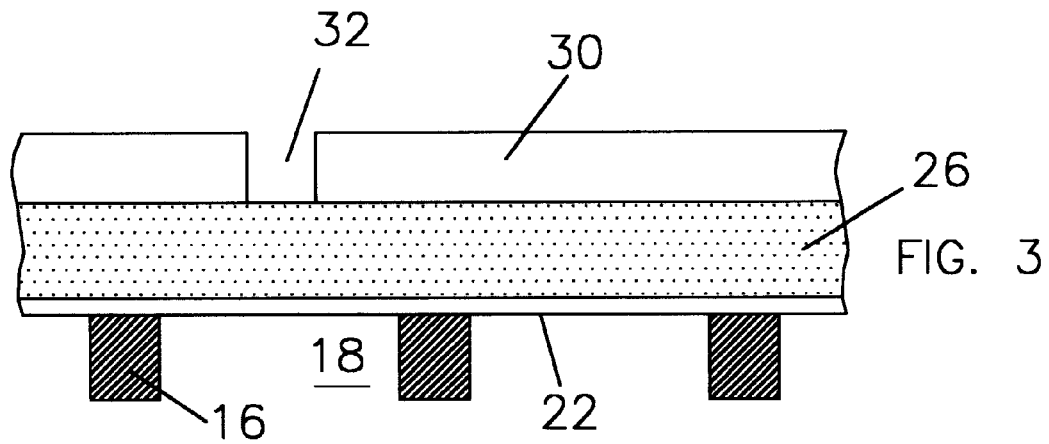
FIG. 3 is a schematic side view of the device after the gate insulator layer, oxide layer, and first photoresist layer have been deposited on the substrate.

Now referring to FIGS. 2 and 3, as indicated at block 14 in FIG. 2 and as shown in FIG. 3, using conventional semiconductor fabrication techniques shallow isolation trenches 16 are formed in a semiconductor substrate 18 and filled with insulating material, e.g., an appropriate oxide. Next, as indicated at block 20 a thin, high-k dielectric gate insulator 22 is deposited on the substrate 18. In accordance with the present invention, the gate insulator 22 is characterized by a high dielectric coefficient "k", preferably with k>25. The gate insulator 22 can be made of, e.g., $TiO_2$ or $Ta_2O_5$.

Moving to block 24, a low temperature field oxide layer 26 is deposited over the gate insulator 22, and then at block 28 a first photoresist layer 30 is deposited on the field oxide layer 26. The first photoresist layer 30 is patterned as shown by, e.g., exposing the photoresist layer 30 to ultraviolet light, to establish a first gate window 32 over the field oxide layer 26.

Figure 4:
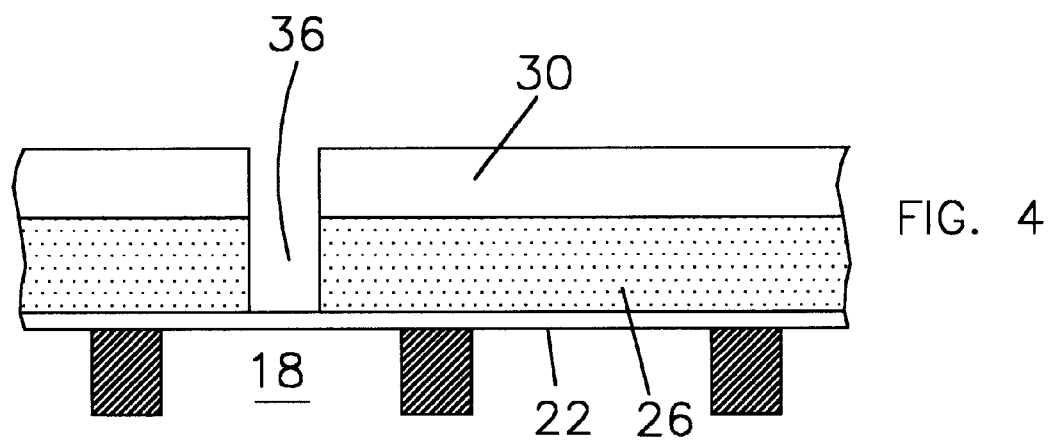
FIG. 4 is a schematic side view of the device after a first gate void has been formed in the oxide layer.

Moving to block 34 of FIG. 2 and now referring to FIG. 4, the oxide layer 26 is subjected to a dry etch. Consequently, portions of the oxide layer 26 that are not protected by the first photoresist layer 30 are removed down to the gate insulator 22 to establish first gate voids 36 (only one gate void shown in FIG. 4). As shown, each gate void 36 is above the isolation trenches 16 of one level and between them relative to the lateral dimension. Stated differently, each gate void 36 is substantially equidistant from two adjacent trenches 16.

Figure 5:
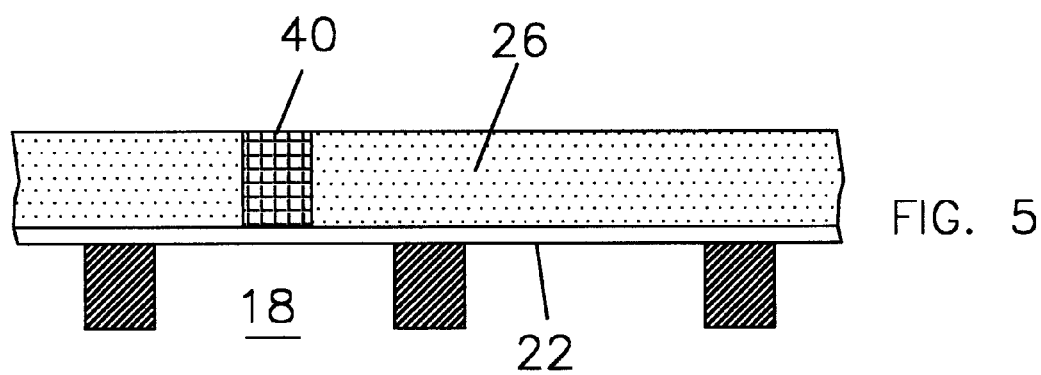
FIG. 5 is a schematic side view of the device after the first photoresist layer has been stripped away and the first gate void has been filled with a first type of metal gate electrode.

Next, at block 38 of FIG. 2 and now referring to FIG. 5, the first photoresist layer 30 is stripped away, and the first gate voids are filled with a first metallic gate electrode material to establish first metallic gate electrode 40. The first metallic gate electrode material can be, e.g., tungsten, titanium (Ti), titanium nitride (TiN), tantalum (Ta), tantalum nitride, and molybdenum (Mo). After deposition, the first gate electrodes 40 are polished down to the level of the top surface of the oxide layer 26 as shown.

Figure 6:
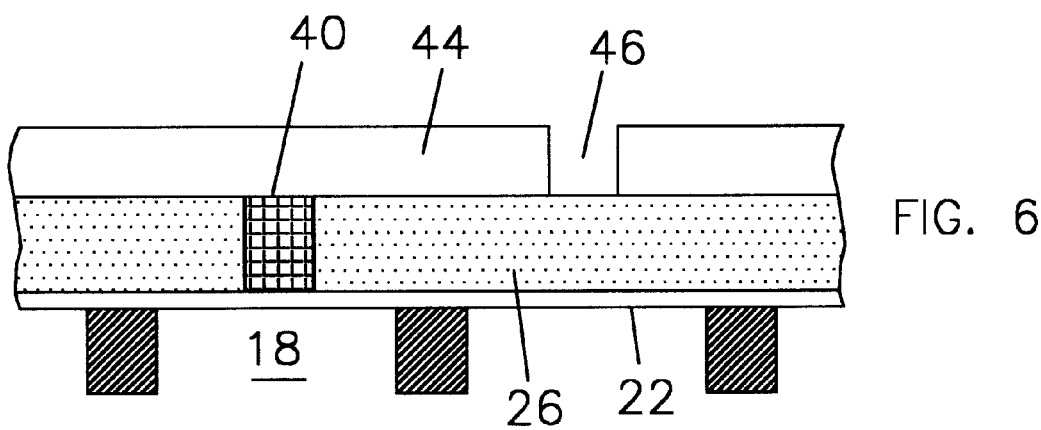
FIG. 6 is a schematic side view of the device after the second photoresist layer has been deposited and patterned.

Proceeding to block 42 and now referring to FIG. 6, after the first gate electrodes 40 have been established, a second photoresist layer 44 is deposited on the field oxide layer 26. The second photoresist layer 44 is patterned as shown by, e.g., exposing the photoresist layer 44 to ultraviolet light, to establish a second gate window 46 over the field oxide layer 26.

Figure 7:
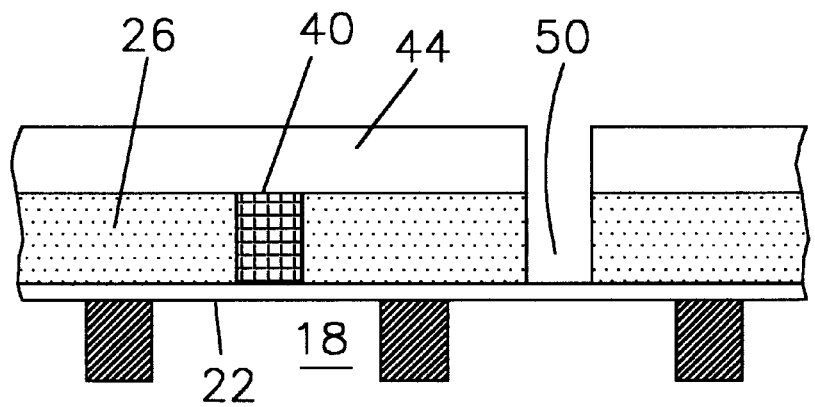
FIG. 7 is a schematic side view of the device after a second gate void has been formed in the oxide layer.

Moving to block 48 of FIG. 2 and now referring to FIG. 7, the oxide layer 26 is subjected to a dry etch. Consequently, portions of the oxide layer 26 that are not protected by the second photoresist layer 44 are removed down to the gate insulator 22 to establish second gate voids 50 (only one gate void shown in FIG. 7).

Figure 8:
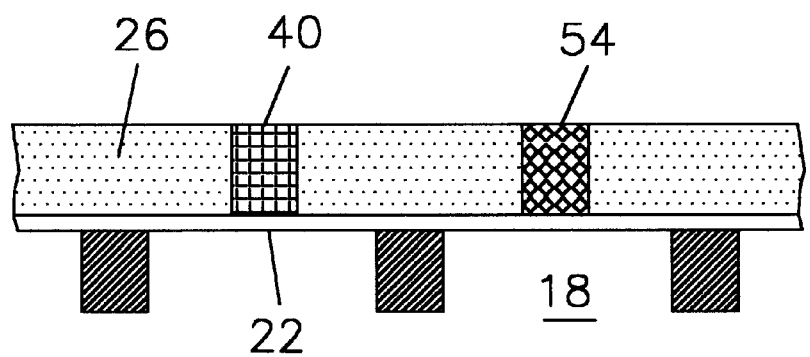
FIG. 8 is a schematic side view of the device after the second photoresist layer has been stripped away and the second gate void has been filled with a second type of metal gate electrode.

Next, at block 52 of FIG. 2 and now referring to FIG. 8, the second photoresist layer 44 is stripped away, and the second gate voids are filled with a second metallic gate electrode material to establish second metallic gate electrode 54. The second metallic gate electrode material can be, e.g., tungsten, titanium (Ti), titanium nitride (TiN), tantalum (Ta), tantalum nitride, and molybdenum (Mo). Or, the second gate electrodes 54 can be used to establish second N-channel MOSFETs having different voltage thresholds than the N-channel MOSFETs established by the first gate electrodes 40. In any case, the second gate electrodes 54 are made of a material that is different from the first gate electrode material, such that the first gate electrode material is suitable for supporting threshold voltage designs of one type of MOSFET (e.g., N-channel or P-channel) and the second gate electrode material is suitable for supporting threshold voltage designs of the other type (e.g., P-channel or N-channel) of MOSFET. After deposition, the second gate electrodes 54 are polished down to the level of the top surface of the oxide layer 26 as shown.

Figure 9:
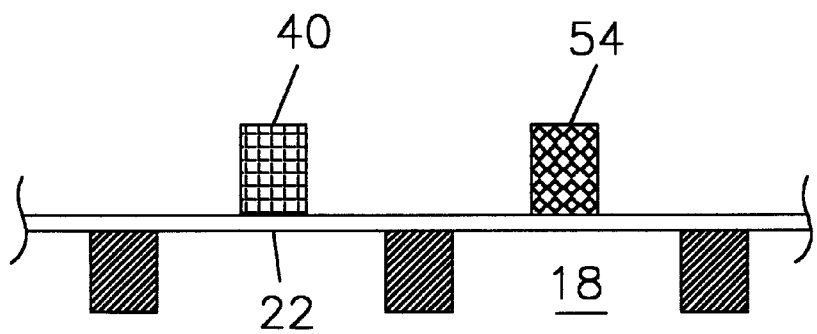
FIG. 9 is a schematic side view of the device after the oxide layer has been removed.
Figure 10:
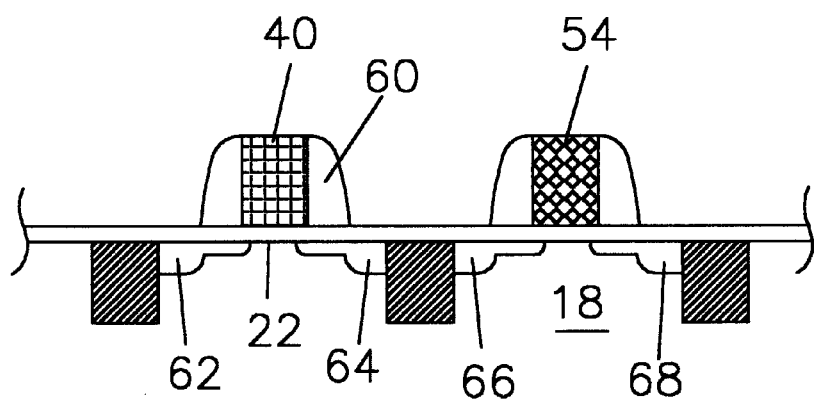
FIG. 10 is a schematic side view of the device after source and drain formation.

As indicated at block 56 and as shown in FIG. 9, the field oxide layer is removed by high selectivity wet etching. Referring to FIG. 10 and block 58 of FIG. 2, sidewall spacers 60 are formed adjacent each gate electrode 40, 54 by means known in the art. Also, appropriate dopant materials are implanted into the substrate 18 by conventional means to establish source and drain regions in the substrate as shown. In the exemplary embodiment shown in FIG. 10 the first gate electrode 40 is intended to be an N-channel MOSFET gate electrode and the second gate electrode 54 is intended to be a P-channel MOSFET gate electrode. Accordingly, N-channel source and drain regions 62, 64 are established in the substrate 18 below the first gate electrode 40, and P-channel source and drain regions 66, 68 are established in the substrate 18 below the second gate electrode 54. Fabrication of the chip 10 is then completed at block 70 by establishing contacts and interconnects in accordance with ULSI principles known in the art.

It is to be understood that while the disclosure above focusses on a single transistor for clarity of disclosure, the chip 10 can include plural transistors each substantially identical to the transistor shown in described above, as well as other circuit components. In any case, it is to be appreciated that owing to the use of the above-described dual damascent process, no metal etching, which is otherwise relatively difficult and expensive to undertake, is required.

While the particular MOS TRANSISTOR WITH DUAL METAL GATE STRUCTURE as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for forming at least two field effect transistors (FET) on at least one semiconductor substrate, comprising:

depositing at least one high-k gate insulator on the substrate;

depositing at least one field oxide layer on the gate insulator;

forming at least first and second gate voids in the field oxide layer;

depositing a first metal gate electrode in the first gate void, the first gate electrode including a first material; and depositing a second metal gate electrode in the second gate void, the second gate electrode including a second material, the second material being different from the first material.

2. The method of claim 1, wherein the gate insulator is characterized by a dielectric constant of at least twenty five (25).

3. The method of claim 2, wherein the gate insulator is made of a material selected from the group of materials including $TiO_2$, $Ta_2O_5$.

4. The method of claim 3, wherein the gate insulator is made of a material selected from the group of materials consisting of $TiO_2$, $Ta_2O_5$.

5. The method of claim 2, wherein at least one of the metal gate electrodes is made of material selected from the group of materials including tungsten, titanium (Ti), titanium nitride (TiN), tantalum (Ta), tantalum nitride, and molybdenum (Mo).

6. The method of claim 1, further comprising forming isolation trenches in the substrate, and establishing the gate voids above the trenches, each gate void being substantially equidistant from two trenches.

7. The method of claim 1, wherein the step of forming at least first and second gate voids in the field oxide layer comprises:

depositing a first photoresist layer on the field oxide layer;

patterning the first photoresist layer to form a first gate window over the field oxide layer;

removing portions of the field oxide layer below the gate window to thereby establish the first gate void;

disposing the first gate electrode in the first gate void;

depositing a second photoresist layer on the field oxide layer;

patterning the second photoresist layer to form a second gate window over the field oxide layer;

removing portions of the field oxide layer below the gate window to thereby establish the second gate void; and disposing the second gate electrode in the second gate void.

* * * * *